United States Patent
McHugh

(10) Patent No.: US 8,065,648 B1
(45) Date of Patent: Nov. 22, 2011

(54) METHOD AND APPARATUS FOR MODELING AN INTEGRATED CIRCUIT IN A COMPUTER AIDED DESIGN SYSTEM

(75) Inventor: George L. McHugh, Berthoud, CO (US)

(73) Assignee: Xilinx, Inc., San Jose, CA (US)

( * ) Notice: Subject to any disclaimer, the term of this patent is extended or adjusted under 35 U.S.C. 154(b) by 395 days.

(21) Appl. No.: 12/260,810

(22) Filed: Oct. 29, 2008

(51) Int. Cl.
*G06F 17/50* (2006.01)
(52) U.S. Cl. .......................................... 716/113; 716/112
(58) Field of Classification Search ........... 716/110–114
See application file for complete search history.

(56) References Cited

U.S. PATENT DOCUMENTS

| | | | | |
|---|---|---|---|---|
| 6,820,245 | B2 * | 11/2004 | Beattie et al. | 716/115 |
| 6,828,963 | B1 * | 12/2004 | Rappoport | 345/419 |
| 7,454,732 | B2 * | 11/2008 | McElvain et al. | 716/125 |
| 7,788,614 | B1 * | 8/2010 | Galloway et al. | 716/113 |

\* cited by examiner

*Primary Examiner* — Jack Chiang
*Assistant Examiner* — Binh Tat
(74) *Attorney, Agent, or Firm* — Robert M. Brush; LeRoy D. Maunu; Lois D. Cartier

(57) ABSTRACT

Method, apparatus, and computer readable medium for modeling an integrated circuit in a computer aided design system (CAD) are described. In some examples, a device model of the integrated circuit is generated in at least one first computer file, the device model having a component hierarchy. A common delay identifier is defined for component instances in the component hierarchy of the device model. A value model is generated for the device model in at least one second computer file. Delay values are defined for the common delay identifier in the value model, at least a portion of the delay values being qualified based on location in the component hierarchy of at least one of the component instances.

17 Claims, 3 Drawing Sheets

METHOD AND APPARATUS FOR MODELING AN INTEGRATED CIRCUIT IN A COMPUTER AIDED DESIGN SYSTEM

FIELD OF THE INVENTION

One or more aspects of the present invention relate generally to integrated circuit design and, more particularly, to a method and apparatus for modeling an integrated circuit in a computer aided design system.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured.

Manufacturers typically provide device models of their PLDs for use with computer aided design (CAD) software. For example, CAD software can use a device model during simulation or other analysis of designs (e.g., timing analysis), as well as for implementation of designs (e.g., placement and routing). One type of attribute included in a device model for various PLD components is delay. Various types of delays may be modeled, such as propagation delay, setup and hold delays, minimum pulse width requirements, and the like. For example, propagation delay can be associated with a path between terminals of a component ("delay path") and can be defined as the length of time it takes the input of the signal path to affect the output of the signal path. A setup and hold delay can be associated with a delay path between the data input pin to the clock pin. A device model for a PLD may include various delays associated with various components therein, such as flip-flops, lookup tables (LUTs), dedicated logic blocks, and the like.

In present device models, the definition of a delay ("delay definition") can be separated from the value of the delay ("delay value"). This allows the delay values to be included in a separate file (sometimes referred to as a "speed file") from the rest of the device model, which can be included in one or more "definition files". Delay values typically change more often than other delay attributes and thus it is desirable to store the delay values in a separate speed file. Thus, the delay values in the device model can be updated merely by updating the speed file. For example, a flip-flop may include a delay definition identified by a name "FF_DELAY". The speed file may include an entry "FF_DELAY 1.2", which indicates a delay value of 1.2 time units (the delay value units can be microseconds, nanoseconds, picoseconds, etc., depending on technology).

One problem with the above approach arises when two instances of a component require different delay values. Since a component is associated with a particular delay definition name, one instance of the component cannot have a different delay value than another instance. If it is discovered a particular instance of a component requires a different delay value than other instance(s), designers must: (1) create a new component that duplicates the definition of the old component except for a new delay definition name; (2) create a new delay definition name for the new component; (3) change the instance of the component to be an instance of this new component; (4) add a delay value for this new delay definition in the speed file; and (5) distribute new definition and speed file(s) to customers. Such a change can be an expensive and difficult process.

SUMMARY OF THE INVENTION

Disclosed herein is a method and apparatus for modeling an integrated circuit in a CAD system that enables different delay values for similar configuration blocks. Embodiments disclosed allow for the differing values without incurring the expense and difficulties previously incurred.

Method, apparatus, and computer readable medium for modeling an integrated circuit in a computer aided design system (CAD) are described. In some embodiments, a device model of the integrated circuit is generated in at least one first computer file, the device model having a component hierarchy. A common delay identifier is defined for component instances in the component hierarchy of the device model. A value model is generated for the device model in at least one second computer file. Delay values are defined for the common delay identifier in the value model, at least a portion of the delay values being qualified based on location in the component hierarchy of at least one of the component instances.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
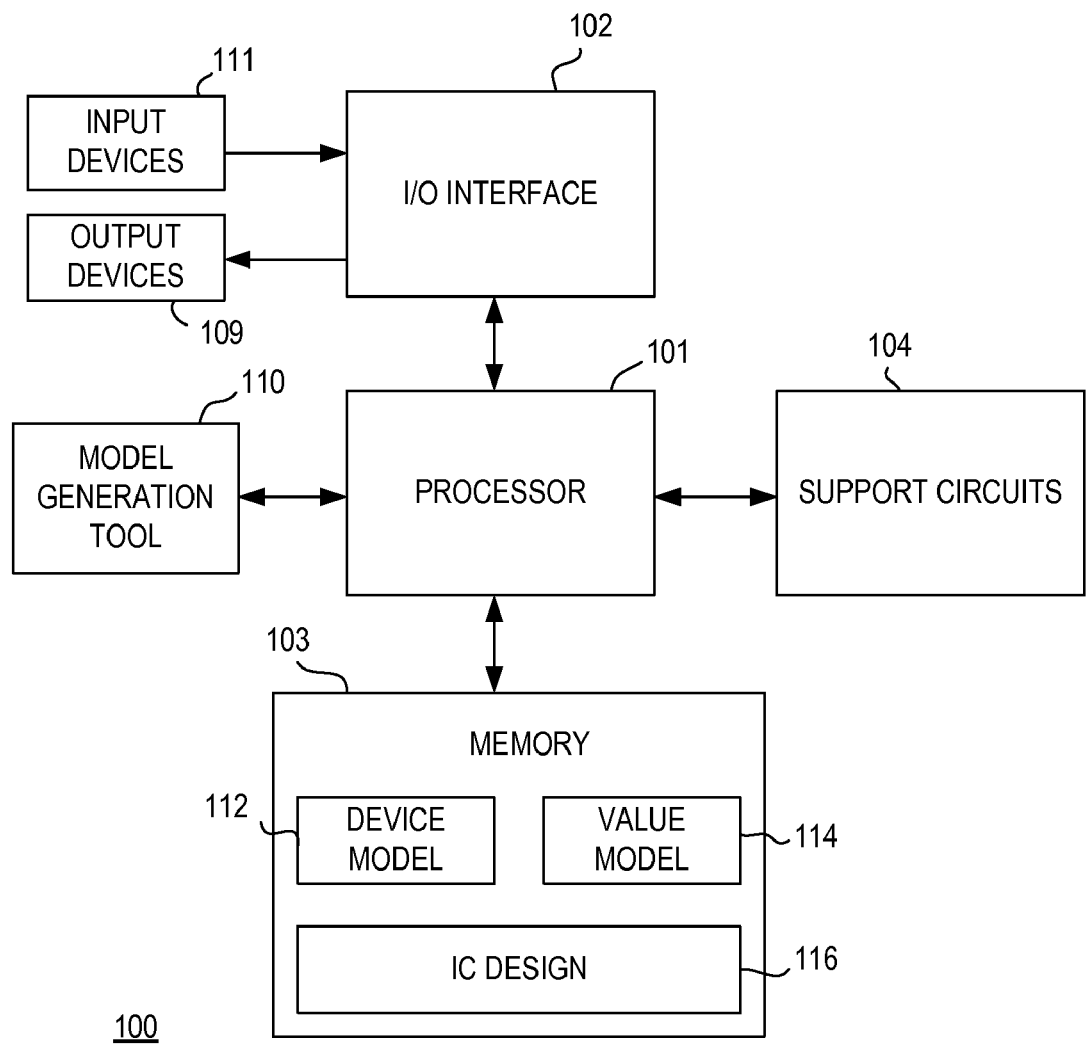
FIG. 1 is a block diagram depicting an exemplary embodiment of a computer aided design (CAD) system in accordance with one or more aspects of the invention.

FIG. 1 is a block diagram depicting an exemplary embodiment of a computer aided design (CAD) system 100 in accordance with one or more aspects of the invention. The CAD system 100 includes a processor 101, a memory 103, various support circuits 104, and an I/O interface 102 (e.g., a computer). The processor 101 may include one or more microprocessors known in the art. The support circuits 104 for the processor 101 include conventional cache, power supplies, clock circuits, data registers, I/O interfaces, and the like. The I/O interface 102 may be directly coupled to the memory 103 or coupled through the processor 101. The I/O interface 102 is coupled to various input devices 111 (e.g., keyboard, mouse, and the like) and output devices 109 (e.g., display, printer, and the like). The memory 103 may include one or more of the following random access memory, read only memory, magneto-resistive read/write memory, optical read/write memory, cache memory, magnetic read/write memory, and the like.

The CAD system 100 further includes a model generation tool 110. In some embodiments, the model generation tool 110 comprises a software program configured for execution by the processor 101. Those skilled in the art will appreciate that the model generation tool 110 may also be implementing using hardware (e.g., hardware specifically designed to perform the functionality described below) or a combination of hardware and software. The model generation tool 110 is configured to generate a device model 112 and a value model 114 from an integrated circuit (IC) design 116. The model generation tool 110 may operate in conjunction with input from a user via the input devices 111. The device model 112, the value model 114, and the IC design 116 may comprise data stored in the memory 103. The IC design 116 may comprise any type of description of an IC, such as a programmable logic device (PLD), field programmable gate array (FPGA), or the like. The device model 112 includes various attributes associated with the IC. The device model 112 can be used during simulation or other analysis of the IC design. In cases where the IC design is for a PLD, the device model 112 can be used during implementation, simulation, and the like of a design to be configured in the PLD (e.g., placement and routing, timing analysis, and the like).

Figure 2:
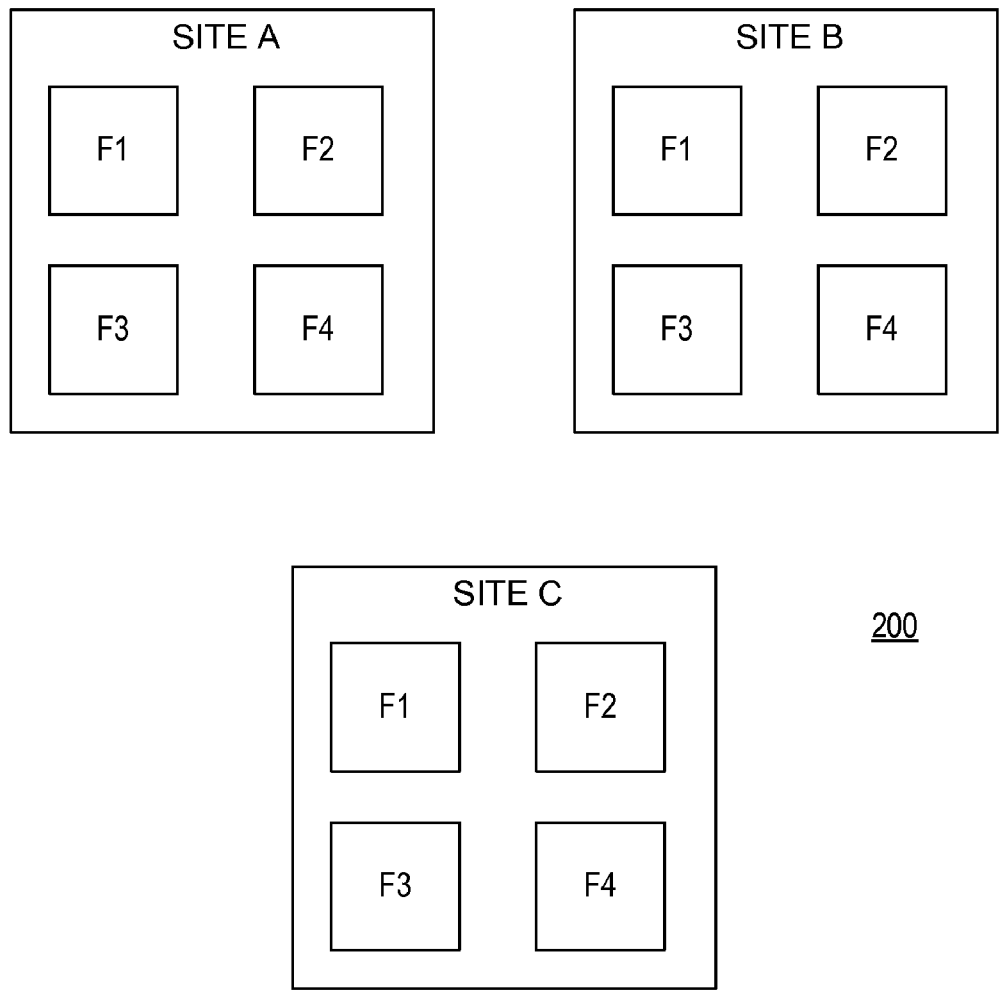
FIG. 2 is a block diagram depicting an exemplary embodiment of a component hierarchy in accordance with one or more aspects of the invention.

The device model 112 may be stored as a file in the memory 103 ("first computer file"). The device model 112 includes a hierarchy of components of the IC design ("component hierarchy"). FIG. 2 is a block diagram depicting an exemplary embodiment of a component hierarchy 200 in accordance with one or more aspects of the invention. The component hierarchy 200 includes three types of sites A, B, and C. A "site" may be a location in the layout of the IC where particular components therein are implemented. Each of the sites A, B, and C include four flip-flops f1, f2, f3, and f4. Each of the flip-flops f1 through f4 in each of the sites A through C can have the same functional properties. Accordingly, each of the flip-flops f1 through f4 in each of the sites A through C can have similar (but not necessarily identical) propagation delays. A flip-flop is a component, whereas a particular flip-flop in the component hierarchy 200 (e.g., the flip-flop f2 in the site C) is an instance of a component ("component instance"). The component hierarchy 200 is meant to be illustrative. For purposes of clarity by example, the component hierarchy 200 only includes two levels of hierarchy (site and component), one type of component (flip-flop), and a particular number of component instances per site (four). It is to be understood that a type IC design may include more than two levels of hierarchy and many different types of components and numbers of component instances.

Returning to FIG. 1, some of the attributes specified by the device model 112 are delay attributes. Delay attributes may include propagation delay, setup and hold time, minimum pulse width, and the like. Those skilled in the art will appreciate that the device model 112 may include various other attributes known in the art. The device model 112 may include various delay definitions ("delay definition"). For example, as noted above, the flip-flops f1 through f4 across the sites A through C may have similar propagation delays, setup and hold times, minimum pulse widths, etc. Thus, the device model 112 may include one or more common delay definitions for the flip-flop component, i.e., one or more common delay definitions for all component instances f1-f4 across sites A through C. A given delay definition may comprise an identifier in the device model 112 ("delay identifier"). For example, a common delay identifier for the flip-flops f1 through f4 across the sites A through C for a propagation delay may be "FF_DELAY_CLK_Q". The delay definition FF_DELAY_CLK_Q may specify that a delay path exists from the clock pin to the Q pin on a flip-flop. The model generation tool 110 may process the IC design 116 to generate a component hierarchy and to generate delay definitions for various components and component instances. In general, a delay definition may be associated with one or more component instances (e.g., a particular group of component instances or all instances of a particular component type). For purposes of clarity by example, embodiments below are described with respect to a common delay identifier for a propagation delay. Those skilled in the art will appreciate that other types of delay definitions may be processed alternatively or in addition to propagation delay.

The value model 114 may be stored as another file in the memory 103 ("second computer file"). The value model 114 includes delay values for the delay definitions defined in the device model 112. In accordance with embodiments of the invention, the delay values in the value model 114 can be qualified based on location of component instances in the component hierarchy. For example, the value model 114 may include a delay value for the delay definition FF_DELAY_CLK_Q associated with the component instances f1-f4 in the sites A-C. The delay value may be specified in the value model as a delay assignment. For example, the delay assignment "FF_DELAY_CLK_Q 1.2" indicates that the delay definition FF_DELAY_CLK_Q has a delay value of "1.2". The delay value may be specified in predefined units of time, such as microseconds, nanoseconds, or the like. If the value model 114 includes the delay assignment "FF_DELAY_CLK_Q 1.2", then all component instances having the delay definition FF_DELAY_CLK_Q are assigned a delay value of "1.2", e.g., all flip-flops f1-f4 in the sites A-C.

A delay definition defined in the device model 112 may include other information besides a value of the delay. For example, a delay definition may include information that the path from clock to output of a component only exists for rising edges of the clock. A delay definition may include information that a particular path only exists if the component is in a particular mode. Such properties can be common to all component instances of the component type regardless of location in the component hierarchy. Thus, such information can be included within the device model 112, rather than being abstracted to the separate value model 114.

The value model 114 may further define qualified delay values. For example, the value model 114 may include the following delay assignments:
FF_DELAY_CLK_Q:A 1.3
FF_DELAY_CLK_Q::f3 1.5
FF_DELAY_CLK_Q:B:f3 1.6
In the above delay assignments, the delay identifier FF_DELAY_CLK_Q is qualified with indicia of location in the component hierarchy 200 ("qualified delay identifier"). That is, each qualified delay identifier in the value model 114 includes a common delay identifier and indicia of location in a component hierarchy. The indicia of location for each qualified delay identifier are indicative of at least one level of the component hierarchy. For example, the qualified delay identifier "FF_DELAY_CLK_Q:A" includes "A" as indicia of location, which is indicative of one level of the component hierarchy 200. The qualified delay identifier "FF_DELAY_CLK_Q:B:f3" includes "B:f3" as indicia of location, which is indicative of two levels of the component hierarchy 200.

In some embodiments, each of the qualified delay identifiers in the value model 114 comprises a concatenation of a common delay identifier and indicia of at least one level of the component hierarchy separated by a predefined token. For example, the colon symbol (:) is used as a token in the above examples of qualified delay identifiers, although various other tokens can be used. Also, the same or token or different token may be used to separate levels of component hierarchy in the indicia of location. In some embodiments, the value model 114 includes two fields: a first field having the qualified delay identifiers (or common delay identifiers if not qualified); and a second field having delay values. In other embodiments, the value model 114 includes a plurality of fields: a first field for common delay identifiers; at least one field for indicia of at least one level of the component hierarchy; and a last field having delay values.

In the present example, indicia of location in the qualified delay identifiers represent at least one of a site level, an instance level, or both a site level and an instance level. As shown in FIG. 2, the site level is above the instance level in the component hierarchy 200 (i.e., the site level is parental to the instance level). The levels of hierarchy represented in the indicia of location may have an order of precedence. For example, a qualified delay identifier with a site level indicium may override a qualified delay identifier with an instance level indicium. The order of precedence may relate to the levels of the component hierarchy 200 (e.g., higher levels get higher precedence and lower levels get lower precedence or vice versa).

In the above examples, delays would be assigned as follows: flip-flops f1, f2, and f4 in site C and site B have a delay of 1.2, due to the delay assignment "FF_DELAY_CLK_Q 1.2" (there are no qualified delay identifiers for such flip-flops). All flip-flops f1 through f4 in site A have a delay of 1.3 due to the delay assignment "FF_DELAY_CLK_Q:A 1.3". Flip-flop f3 in site B has a delay of 1.6 due to the delay assignment "FF_DELAY_CLK_Q:B:f3". Flip-flop f3 in site C has a delay of 1.5 due to the delay assignment "FF_DELAY_CLK_Q::f3".

In this example, site level has precedence over instance level. Thus, the delay assignment "FF_DELAY_CLK_Q:A 1.3" has precedence over "FF_DELAY_CLK_Q::f3 1.5" for the flip-flop 3 in site A. Further, the delay assignment "FF_DELAY_CLK_Q:B:f3 1.6" has precedence over "FF_DELAY_CLK_Q::f3 1.5". As noted above, precedence of site level or instance level is merely exemplary and could be reversed. In general, there may be a plurality of levels in the component hierarchy and the precedence between the levels may be defined in any manner.

The delay assignments in the value model 114 can be applied when delays for specific component instances are evaluated (e.g., during simulation, implementation, etc.). In the value model 114, the additional information used as a qualification in a delay assignment is not part of the original delay definition as set forth by the device model 112. That is, the use of the qualified delay identifiers does not require the common delay identifier defined by the device model 112 to be changed. Thus, different individual component instances may be assigned different delays just be changing delay values or by inserting qualified delay assignments in the value model 114; no corresponding changes in the device model 112 are required.

Figure 3:
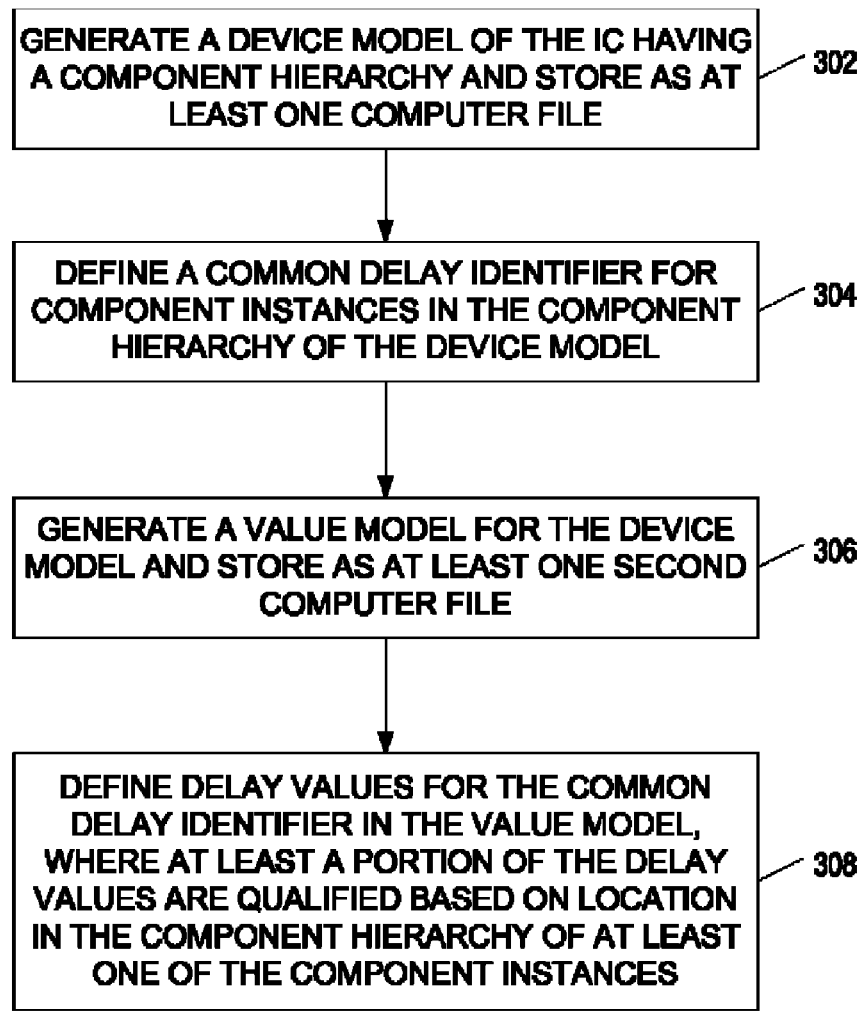
FIG. 3 is a flow diagram depicting an exemplary embodiment of a method of modeling an IC in a CAD system in accordance with one or more aspects of the invention.

FIG. 3 is a flow diagram depicting an exemplary embodiment of a method 300 of modeling an IC in a CAD system in accordance with one or more aspects of the invention. The method 300 be implemented using the CAD system 100 described above. The method 300 begins at step 302, where a device model of the IC is generated and stored as at least one computer file. The device model includes a component hierarchy. At step 304, a common delay identifier is defined for component instances in the component hierarchy of the device model. At step 306, a value model for the device model is generated and stored as at least one second computer file. At step 308, delay values are defined for the common delay identifier in the value model, where at least a portion of the delay values are qualified based on location in the component hierarchy of at least one of the component instances. For example, step 308 may include generating qualified delay identifiers each including the common delay identifier and indicia of location in the component hierarchy, and assigning one of the delay values to each of the qualified delay identifiers.

For purposes of clarity by example, the method 300 is described with respect to defining a common delay identifier for a specific group of component instances in the component hierarchy (step 304). Those skilled in the art will appreciate that the method 300 may be performed with multiple common delay identifiers for multiple groups of component instances, respectively. In such case, delay values are defined for each of the common delay identifiers and at least a portion of the delay values for each of the common delay identifiers are qualified based on the component hierarchy. Moreover, the method 300 may be performed with multiple common delay identifiers for the specific group of component instances in the component hierarchy (e.g., a delay identifier for propagation delay, a delay identifier for setup and hold time, a delay identifier for pulse width, etc.).

An aspect of the invention is implemented as a program product for use with a computer system. Program(s) of the program product defines functions of embodiments and can be contained on a variety of computer-readable media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). Such computer-readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A processor-implemented method of modeling an integrated circuit in a computer aided design (CAD) system, comprising:

generating a device model of the integrated circuit in at least one first computer file, the device model having a component hierarchy;

defining a common delay identifier for component instances in the component hierarchy of the device model;

generating a value model for the device model in at least one second computer file;
defining delay values for the common delay identifier in the value model, at least a portion of the delay values being qualified based on location in the component hierarchy of at least one of the component instances; and wherein the defining delay values comprises:
generating qualified delay identifiers, each of the qualified delay identifiers including the common delay identifier and indicia of location in the component hierarchy;
assigning one of the delay values to each of the qualified delay identifiers; and
outputting the delay values,
wherein the generating a device model, the defining the common delay identifier, the generating the value model, the defining delay values, and the outputting are performed by the processor.

2. The method of claim 1, wherein the qualified delay identifiers comprise a first field of the value model, and the delay values comprise a second field of the value model.

3. The method of claim 2, wherein the indicia of location for each qualified delay identifier is indicative of at least one level of the component hierarchy.

4. The method of claim 3, wherein each of the qualified delay identifiers comprises a concatenation of the common delay identifier and the at least one level of the component hierarchy separated by a token.

5. The method of claim 1, wherein the indicia of location for each qualified delay identifier is indicative of at least one level of the component hierarchy, wherein the delay identifiers comprise a first field for the common delay identifier, at least one additional field for the at least one level of the component hierarchy, and wherein the delay values comprise a last field of the value model.

6. The method of claim 1, wherein the indicia of location for each qualified delay identifier is indicative of at least one level of the component hierarchy, the at least one level including a site level, an instance level, or both a site level and an instance level, the site level being parental to the instance level.

7. The method of claim 1, wherein the indicia of location for each qualified delay identifier is indicative of a plurality of levels of the component hierarchy having an order of precedence.

8. Apparatus for modeling an integrated circuit in a computer aided design (CAD) system, comprising:
means for generating a device model of the integrated circuit in at least one first computer file, the device model having a component hierarchy;
means for defining a common delay identifier for component instances in the component hierarchy of the device model;
means for generating a value model for the device model in at least one second computer file;
means for defining delay values for the common delay identifier in the value model, at least a portion of the delay values being qualified based on location in the component hierarchy of at least one of the component instances; and wherein the means for defining delay values comprises:
means for generating qualified delay identifiers, each of the qualified delay identifiers including the common delay identifier and indicia of location in the component hierarchy;
means for assigning one of the delay values to each of the qualified delay identifiers; and
means for outputting the delay values.

9. The apparatus of claim 8, wherein the qualified delay identifiers comprise a first field of the value model, and the delay values comprise a second field of the value model.

10. The apparatus of claim 9, wherein the indicia of location for each qualified delay identifier is indicative of at least one level of the component hierarchy.

11. The apparatus of claim 8, wherein the indicia of location for each qualified delay identifier is indicative of at least one level of the component hierarchy, wherein the delay identifiers comprise a first field for the common delay identifier, at least one additional field for the at least one level of the component hierarchy, and wherein the delay values comprise a last field of the value model.

12. The apparatus of claim 8, wherein the indicia of location for each qualified delay identifier is indicative of at least one level of the component hierarchy, the at least one level including a site level, an instance level, or both a site level and an instance level, the site level being parental to the instance level.

13. The apparatus of claim 8, wherein the indicia of location for each qualified delay identifier is indicative of a plurality of levels of the component hierarchy having an order of precedence.

14. An article of manufacture, comprising:
a non-transitory computer readable medium having stored thereon instructions that when executed by a processor cause the processor to perform a method of modeling an integrated circuit in a computer aided design (CAD) system, comprising:
generating a device model of the integrated circuit in at least one first computer file, the device model having a component hierarchy;
defining a common delay identifier for component instances in the component hierarchy of the device model;
generating a value model for the device model in at least one second computer file;
defining delay values for the common delay identifier in the value model, at least a portion of the delay values being qualified based on location in the component hierarchy of at least one of the component instances; and wherein the defining delay values comprises:
generating qualified delay identifiers, each of the qualified delay identifiers including the common delay identifier and indicia of location in the component hierarchy;
assigning one of the delay values to each of the qualified delay identifiers; and
outputting the delay values.

15. The article of manufacture of claim 14, wherein the qualified delay identifiers comprise a first field of the value model, and the delay values comprise a second field of the value model.

16. The article of manufacture of claim 15, wherein the indicia of location for each qualified delay identifier is indicative of at least one level of the component hierarchy.

17. The article of manufacture of claim 14, wherein the indicia of location for each qualified delay identifier is indicative of at least one level of the component hierarchy, wherein the delay identifiers comprise a first field for the common delay identifier, at least one additional field for the at least one level of the component hierarchy, and wherein the delay values comprise a last field of the value model.

* * * * *